United States Patent
Crawford et al.

(10) Patent No.: US 7,262,584 B2
(45) Date of Patent: Aug. 28, 2007

(54) EFFICIENT FAST PULSED LASER OR LIGHT-EMITTING DIODE DRIVER

(75) Inventors: Ian D. Crawford, Longwood, FL (US); Miguel Morales, Winter Springs, FL (US)

(73) Assignee: Analog Modules, Inc, Longwood, FL (US)

( * ) Notice: Subject to any disclaimer, the term of this patent is extended or adjusted under 35 U.S.C. 154(b) by 446 days.

(21) Appl. No.: 11/054,349

(22) Filed: Feb. 9, 2005

(65) Prior Publication Data
US 2005/0185428 A1 Aug. 25, 2005

Related U.S. Application Data

(63) Continuation-in-part of application No. 10/889,308, filed on Jul. 12, 2004.

(60) Provisional application No. 60/545,789, filed on Feb. 19, 2004, provisional application No. 60/578,667, filed on Jun. 9, 2004.

(51) Int. Cl.
*G05F 1/59* (2006.01)
(52) U.S. Cl. .................. 323/272; 315/169.1; 323/282
(58) Field of Classification Search ............. 315/169.1; 323/272, 282, 225, 288; 232/351, 222
See application file for complete search history.

(56) References Cited

U.S. PATENT DOCUMENTS

| | | | |
|---|---|---|---|
| 5,287,372 A | | 2/1994 | Ortiz |
| 5,430,405 A | * | 7/1995 | Cohen ........................ 327/581 |
| 5,831,420 A | * | 11/1998 | Myers ........................ 323/282 |
| 6,087,811 A | * | 7/2000 | Crawford et al. ........... 320/139 |
| 6,587,490 B2 | * | 7/2003 | Crawford ................. 372/38.07 |
| 6,697,402 B2 | | 2/2004 | Crawford |
| 6,856,119 B2 | * | 2/2005 | Crawford .................... 320/166 |
| 6,894,461 B1 | * | 5/2005 | Hack et al. ................. 323/205 |
| 7,005,835 B2 | * | 2/2006 | Brooks et al. .............. 323/282 |
| 7,009,370 B2 | * | 3/2006 | Deaton ....................... 323/272 |
| 2005/0276294 A1 | | 12/2005 | Crawford et al. |

OTHER PUBLICATIONS

Model 779A, *High Power CW or Pulsed Laser Diode Driver*, Analog Modules, Inc., Longwood Florida (www.analogmodules. com).

* cited by examiner

*Primary Examiner*—Douglas W. Owens
*Assistant Examiner*—Chuc Tran
(74) *Attorney, Agent, or Firm*—Gerald E. Linden; Dwight A. Stauffer

(57) ABSTRACT

A capacitor is connected to the output of a multiphase power converter, and a current-driven device (e.g., LED or laser diode) is also connected to the power converter output. A solid state switch (FET or IGBT) is connected in series with the current-driven device. Means are provided for sensing current through the current-driven device. An error amplifier compares sensed current through the current-driven device with a current level demand signal and controls the output of the power converter. Means are provided for turning the switch on and off and may be (i) a fast comparator receiving a voltage reference signal at one input and the current level demand signal at another input, and outputting the switch on/off signal to the switch or (ii) an externally-generated logic signal provided directly to the switch.

20 Claims, 1 Drawing Sheet

EFFICIENT FAST PULSED LASER OR LIGHT-EMITTING DIODE DRIVER

CROSS-REFERENCE(S) TO RELATED APPLICATION(S)

This application claims priority to U.S. Provisional Patent Application No. 60/545,789 filed Feb. 19, 2004 (Crawford, Morales).

This application is also a continuation-in-part of U.S. patent application Ser. No. 10/889,308 filed Jul. 12, 2004 (Crawford, Harwick, Morales), which is a non-provisional application claiming priority to U.S. Provisional Patent Application No. 60/578,667 filed Jun. 9, 2004.

TECHNICAL FIELD OF THE INVENTION

The invention relates to pulsed current drivers for driving current-driven devices (loads) such as light emitting diodes (LEDs) or laser diodes.

BACKGROUND OF THE INVENTION

Pulsed laser or LED diode drivers are used to generate pulses of current, typically into a series array of lasing diodes. The light output is used for various purposes, such as pumping lasers, or timed illumination. The driver design typically comprises a storage capacitor, the laser diode array, and a pulsed current source, connected in series. When the current source is turned on, energy is drawn from the capacitor through the diode array. The voltage on the capacitor falls, so the current source must have sufficient compliance to continue to operate as voltage falls. For good efficiency, a low voltage loss across the current source is desired, but this requires a large and bulky capacitor to minimize voltage sag.

It is desirable to efficiently pulse a laser diode or light-emitting diode for a number of applications. Using a linear current source is inefficient because voltage is dropped across the linear pass element, or shunt element as shown in commonly-owned U.S. Pat. No. 6,587,490. Turning a single phase switching power supply off and on from zero is problematical because the control loop bandwidth limits the potential switching speed. The control loop is slower than the switching frequency to work correctly. The proposed approach allows good pulsed current waveforms with greater than 90% efficiency possible.

Figure 1:
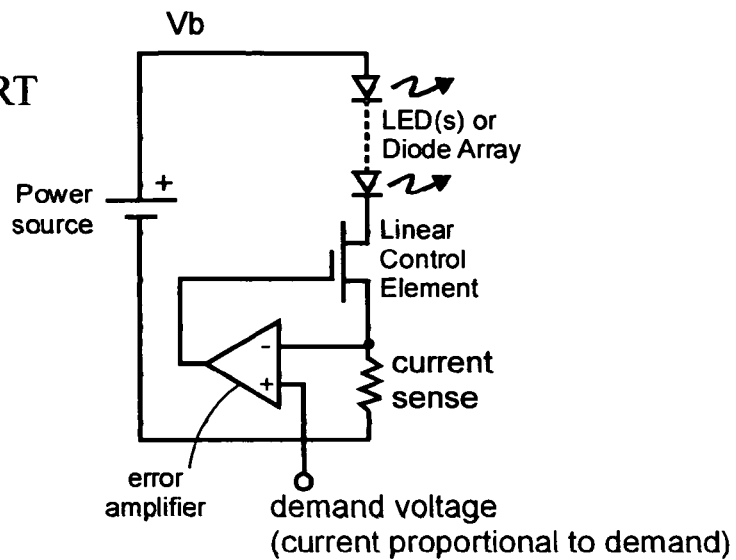

Analog constant current sources or pulsed analog constant current sources using linear dissipative pass elements have been used as diode drivers to power light emitting diodes (LED's), often laser diodes. FIG. 1 illustrates an array of LEDs (or diode array) that are connected to a power source. A linear control (pass) element is disposed in the return path from the LED array to the power source. Current flowing through the LEDs flows through a current sense resistor which supplies a voltage indicative of current to an input of an error amplifier, the other input of which receives a reference demand voltage indicative of the desires current. The output of the amplifier controls the linear control element to maintain a constant current through the LEDs. This is a simple, straightforward analog control loop. Such analog current sources are inefficient due to power (e.g., heat) dissipation in the linear pass element controlling the current.

Commonly-owned U.S. Pat. No. 6,697,402 shows a method to turn on a diode quickly by storing current in an inductor. Commonly-owned U.S. Pat. No. 6,587,490 shows a dissipative linear shunt bypass regulator. The applicant's (Analog Modules, Inc.) own Model 779A "High Power CW or Pulsed Laser Diode Driver" shows a typical linear driver (see website of Analog Modules, Inc. for Data_sht/779a.pdf). U.S. Pat. No. 5,287,372 (Ortiz) shows a quasi-resonant diode drive current source.

BRIEF DESCRIPTION (SUMMARY) OF THE INVENTION

It is an object of the invention to provide an improved technique for driving pulsed current-driven devices (loads) such as light emitting diodes (LEDs) or laser diodes.

According to the invention, generally, the output of a power converter is stored in a reservoir capacitor. A saturated switch in series with a diode load is used to control the current OFF and ON into the diode load, and the voltage on the reservoir capacitors set up by the power supply demand is used to regulate this current flow. A current sensor monitoring the diode current measures the current flow and the signal is compared to the demanded current. The error is amplified and adjusts the converter output voltage to null the error. The system is optimized for pulses, and can use a standard polyphase (also known as multiphase) controller (power converter). The invention is useful as a polyphase or multiple phase (multiphase) light-emitting diode driver.

According to the invention, a pulsed current driver for driving current-driven devices comprises: a power converter having an output; a capacitor connected to the power converter output; a current-driven device connected to the power converter output; a switch connected in series with the current-driven device; means for sensing current through the current-driven device and providing a current measurement signal in response thereto; an error amplifier having two inputs and an output, receiving a current level demand signal at its one input and the current measurement signal at its other input, and providing a control signal at its output for controlling the output of the power converter; and means for turning the switch on and off by providing a switch on/off signal to the switch in response to an externally-generated pulsed signal. The means for turning the switch on and off may be (i) a fast comparator receiving a voltage reference signal at one input and the current level demand signal at another input, and outputting the switch on/off signal to the switch or (ii) an externally-generated logic signal provided directly to the switch. The externally-generated pulsed signal for turning the switch on and off may be (i) a part of the current level demand signal or (ii) separate from the current level demand signal. The power converter preferably comprises a multiphase controller. The current-driven device is typically a light emitting diode (LED), or a laser diode. The switch comprises a solid state switching means such as a field effect transistor (FET) or an insulated-gate bipolar transistor (IGBT). The means for sensing current is typically a low-value resistor or a Hall-effect sensor. The switch is typically turned on and off at a frequency in the range of ten to thousands of Hertz with a duty cycle in the range of 0.001 to 0.5 (0.1-50%).

According to the invention, a method of driving a current-driven device comprises: providing a power converter having an output; providing a reservoir capacitor connected to the power converter output; connecting a current-driven device to the power converter output; connecting a switch in series with the current-driven device; providing an externally-generated pulsed signal for turning the switch on and off; and controlling the output of the power converter by comparing current flowing through the current-driven device to an externally-provided current level demand voltage signal.

According to the invention, a method of providing fast risetime current pulses for driving a light-emitting current-driven device comprises: providing a multiphase power converter having an output; providing a reservoir capacitor connected to the power converter output; connecting a light-emitting current-driven device directly to the power converter output; connecting a switch in series with the current-driven device; providing an externally-generated pulsed signal for turning the switch on and off; and controlling the output of the power converter by comparing current flowing through the current-driven device to an externally-provided current level demand voltage signal.

Pulsed laser or LED diode drivers are used to generate pulses of current, typically into a series array of lasing diodes.

Generally, the present invention is useful for driving any light-emitting current fed (driven) device, including laser diodes, LEDs, and the like with a positive resistance. (Positive resistance means that if the voltage across the load or current driven device increases, the current increases. By this means the current can be controlled monotonically from the voltage.) The invention could also be useful for driving other than light-emitting current fed devices (if any) with operating characteristics comparable to that of light-emitting current fed devices.

Other objects, features and advantages of the invention will become apparent in light of the following description thereof.

BRIEF DESCRIPTION OF THE DRAWING(S)

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Conventional electronic components may be labeled with conventional schematic-style references comprising a letter (e.g., A, C, Q, R) indicating the type of electronic component (e.g., amplifier, capacitor, transistor, resistor, respectively) followed by a number indicating the iteration of that element (e.g., "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown.

The structure, operation, and advantages of the present preferred embodiment of the invention will become further apparent upon consideration of the following description taken in conjunction with the accompanying drawings.

Figure 2:
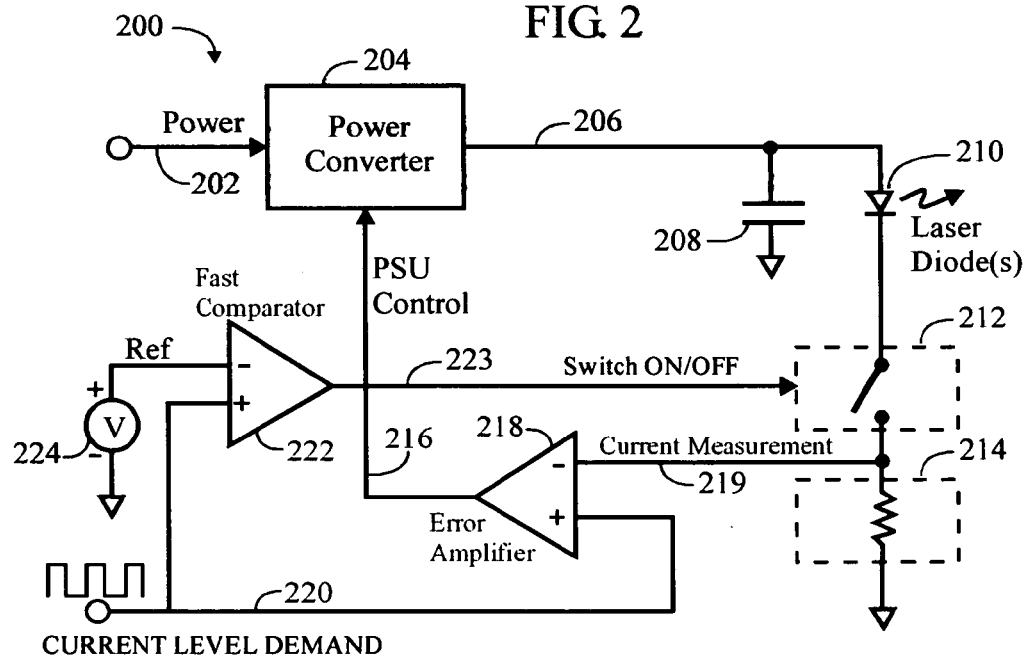
Figure 2A:
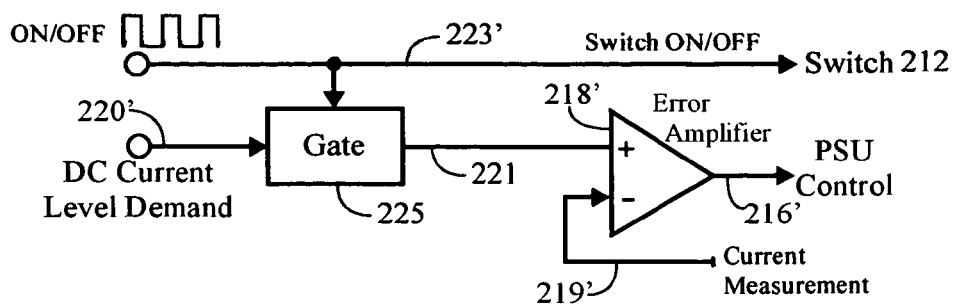

FIG. 1 is a schematic diagram of a prior-art diode driver.
FIG. 2 is a schematic diagram of an embodiment of the invention.
FIG. 2A is a schematic diagram of an alternate embodiment of the invention.

DETAILED DESCRIPTION OF THE INVENTION

The invention is a pulsed current driver for driving current-driven devices (loads) such as light emitting diodes (LEDs) or laser diodes.

FIG. 2 is a schematic diagram of an embodiment of a pulsed current driver 200 of the present invention. Power is provided on an input line 202 to a power converter 204. The power converter is also referred to as a power supply unit, or "PSU".

The power converter 202 would normally be supplied with DC (direct current) voltage, but it could also rectify AC (alternating current) into the DC voltage needed, then use preferably multiple phases to generate the current for the load with fast control response.

The output of the PSU 204 is provided on a line 206 to an output filter (reservoir) capacitor 208, and to an end (e.g., anode) of a laser diode or light-emitting diode 210, or an array of such diodes or similar light emitting current fed device with a positive resistance. The other end (e.g., cathode) of the laser or LED 210 is connected through a switch 212, and through a current sensing means such as a resistor 214, to ground.

The output capacitor 208 may be several capacitors connected in parallel. The LED 210 is exemplary of a "current-driven device" (i.e., a device that operates responsive to current, rather than voltage). The switch 212 may be connected on either side (end) of the LED 210, as long as it is connected in series with the LED 210 between the output of the power converter 204 and ground. The switch 212 is preferably a solid state switching means, such as a FET (field effect transistor) that is either "OFF" or "ON" (in saturated mode). The switch may also be an Insulated-Gate Bipolar Transistor (IGBT).

The PSU 204 can be a standard polyphase controller developed for low voltage computer DC applications, such as the LTC3731 by Linear Technology, or even a single-phase converter controller. Use of a polyphase (also known as multiphase or multiple phase) controller is preferred because the high switching frequency allows for a fast controlled rise time and low ripple. A multiphase power supply (PSU) allows for the use of smaller output filter (reservoir) capacitor(s) with low ripple. Multiphase means that multiple output pulses combine to form a low amplitude and higher frequency ripple. Any high-frequency converter with low ripple and a fast response to demand input signals may be used.

A useful multiphase (polyphase) diode driver is described in the aforementioned commonly-owned, copending U.S. patent application Ser. No. 10/889,308 filed Jul. 12, 2004 (Crawford, Harwick, Morales) and its corresponding Provisional Patent Application No. 60/578,667 filed Jun. 9, 2004, both of which are incorporated in their entirety by reference herein. Generally, as disclosed therein, A driver supplying a total current to a load has a plurality (n) of driver stages (ST1 ... STn). One stage is a master stage. Each driver stage has a switching device (Q) and an inductor (L) connected in series between the switching device and the output of the driver stage. The switching devices are turned ON in sequence with one another, during a cycle time (Tc) which is determined by sensing current through the inductor (L1) in the master stage. When the switching device is turned ON current through the inductor rises, when the inductor current reaches the value of a demanded current the switch is turned OFF, and after the switch is turned OFF the inductor continues to supply (output) current to the load with a current which ramps down. A rectifying device (D) connected between the inductor and the supply line allows current to continue to flow in the inductor and be supplied to the load after the switch is turned OFF.

By using a polyphase or multiphase driver, the turn on response of the Power Converter 204 is fast and the ripple on the capacitor 208 is low so that no additional filtering is required between the capacitor 208 and the load 210. (The load is connected directly to the output of the power converter.) Additional filtering would slow the current risetime. Therefore, the invention is capable of providing fast risetime current pulses to the current-driven device (load).

A typical application for the pulsed current driver 200 of the present invention is solid state laser pumping or scene illumination using the aforementioned LTC3731 or similar controller for driving a laser diode or array such as Coherent Light Stack type laser diodes, and a reservoir capacitor having a capacity of hundreds of microFarads (µF).

With reference to FIG. 2, the current flow to the laser or light-emitting diode 210 and the switch 212 is sensed by means of the current-sensing means 214 which can be a low-value resistor, current transformer or Hall-effect sensor connected in series with the diode/switch, or by means for measuring a voltage drop across the saturated switch 212. The current sensor rise time needs to be faster than the width of the narrowest pulse to be produced. An indication of current through the current sensor 214 is returned to the power converter 204. This arrangement operates as follows.

The output of the PSU 204 is controlled by a signal (PSU Control) on a line 216 from an operational amplifier (Op-Amp) 218 functioning as an error amplifier.

The error amplifier 218 compares the current flowing in (through) the laser diode 210 and switch 212 series combination (as indicated by the voltage signal on line 219) to a Current Level Demand voltage signal on a line 220. The Current Level Demand signal is provided from an external source (not shown). For a typical pulsed application, the Current Level Demand signal is pulsed, typically a rectangular shaped wave, having a frequency (or period) and a duty cycle (percent "on" time). Typical values for frequency are ten to thousands of Hertz (e.g., 1000 Hz), and duty cycle from 0.001 to 0.5 (0.1-50%). (A 50% duty cycle rectangular wave is typically referred to as a square wave.)

The Current Level Demand signal on the line 220 is also connected to an input of a fast comparator 222. The other input of the fast comparator 222 is connected to a voltage reference signal 224. The output of the fast comparator 222 is a Switch ON/OFF signal connected via line 223 to the switch 212, to turn the switch ON and OFF.

The switch 212 is turned ON whenever the Current Level Demand (on 220) is above zero. A convenient way to accomplish this is to set the reference voltage 224 to just above zero, and use the fast comparator 222 to turn ON the switch 212 whenever the Current Level Demand voltage 220 exceeds the reference voltage 224.

FIG. 2A illustrates an alternate means for controlling the ON/OFF state of the switch 212. In this example, a Switch ON/OFF signal from an external source (not shown) which is a pulsed rectangular shaped signal is provided on line 223' (compare 223, FIG. 2) and is directly applied to the switch (212, not shown), and a DC (direct current, constant, not pulsed) level signal provided on line 220' (compare 220, FIG. 2) represents the Current Level Demand. The Current Level Demand may be gated by an analog switch ("GATE") 225 to the Power Converter (204, FIG. 2) by the Switch ON/OFF Pulses. An error amplifier 218' (compare 218) compares the current flowing in (through) the laser diode 210 and switch 212 series combination (on line 219') to the gated Current Level Demand analog voltage signal on a line 221, and outputs the PSU Control signal on the line 216' (compare 216) to the Power Converter 204.

In the embodiment of FIG. 2, the Current Level Demand signal is generated external to the current driver circuit 200, and is pulsed. The Current Level Demand signal controls both the switch 212 and the power converter 204. In the FIG. 2 embodiment, the Current Level Demand Signal serves two purposes: (1) setting the level for the LED output, and (2) controlling the timing of LED pulses. The Current Level Demand Signal comprises an externally generated pulsed analog signal for turning the switch 212 on and off and simultaneously setting the output current level. The externally-generated pulsed signal is part of the Current Level Demand signal.

In the embodiment of FIG. 2A the Current Level Demand signal is generated external to the current driver circuit, and is DC (not pulsed). A separate pulsed ON/OFF logic signal (223') is generated externally, and directly controls the switch 212. The Current Level Demand signal is gated by a switch 225 which passes the analog level of the DC Current Level Demand when the ON/OFF signal is in the ON state. This circuit is within the driver circuit 200, and controls the Power Converter 204. In the FIG. 2A embodiment, the Current Level Demand Signal serves one purpose—setting the level for the LED output. The separate ON/OFF signal is the externally-generated pulsed signal for turning the switch on and off for controlling the timing of LED pulses. The externally-generated pulsed signal is separate from the Current Level Demand signal.

How it Works

The laser (or light-emitting) diode current demand level on line 220 is compared by the error amplifier 218 to the actual current as measured by the sensor 214. When the current demand is increased from zero to a required value, the power supply (PSU) 204 is turned hard "ON" by the error amplifier 218 and the output reservoir capacitor 208 is charged. Simultaneously, the series switch 212 is turned on. Current starts to flow in the laser diode 210 and when the demanded current is reached, the power supply 204 regulates at a voltage to generate the required current flow in the laser or LED diode 210 and switch 212. This voltage adjusts for and depends on the V-I characteristics of the load at that time.

At the end of the desired pulse, the demand goes to zero, the switch 212 is turned off to stop current flow through the diode 210, and the power supply 204 is simultaneously turned "off" as the current demand (220) is zero. The voltage on the reservoir capacitor 208 stays essentially constant until the next pulse since the load (210) as been removed. When the next and subsequent pulse currents are demanded (220), the rise time of current in the load is fast because the reservoir capacitor 208 is already charged up to the expected voltage to generate the required current for the next pulse in the stream (sequence, train) of pulses. (It is assumed that the stream of pulses will have substantially equal magnitude. However, in any case, the fact that the reservoir capacitor is "pre-charged" will favorably influence the rise time of a subsequent pulse.)

Although the rise time of the initial pulse of a pulse train may be slower (than the subsequent/remainder of pulses in the pulse train), the remainder of pulses will have a fast rise time and fall time. Because the switch 212 is saturated (for example, as low as a milliohm resistance for two or three paralleled FETs) and multiphase converters are available with efficiencies greater the 90%, this approach can give very high overall efficiency. It is capable of working with various duty cycles, and is capable of continuous (CW) operation by turning on the demand level (220) as a current reference.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, regarding comparing measured current to demanded current, it should be understood that if a preset voltage is set knowing the load characteristics, then a certain current will flow, so it (closing the loop on current) is not strictly necessary. The current measurement, comparison and error feedback will of course set the current more accurately in the load to take account of temperature variations, device variations, etc. and provides "current control" somewhat independent of the load characteristics.

What is claimed is:

1. A pulsed current driver for driving current-driven devices comprising:
   a power converter having an output;
   a capacitor connected to the power converter output;
   a current-driven device connected to the power converter output;
   a switch connected in series with the current-driven device;
   means for sensing current through the current-driven device and providing a current measurement signal in response thereto;
   an error amplifier having two inputs and an output, receiving a current level demand signal at its one input and the current measurement signal at its other input, and providing a control signal at its output for controlling the output of the power converter; and
   means for turning the switch on and off by providing a switch on/off signal to the switch in response to an externally-generated pulsed signal.

2. The pulsed current driver of claim 1, wherein:
   the means for turning the switch on and off comprises a fast comparator receiving a voltage reference signal at one input and the current level demand signal at another input, and outputting the switch on/off signal to the switch.

3. The pulsed current driver of claim 1, wherein:
   the means for turning the switch on and off comprises an externally-generated logic signal provided directly to the switch.

4. The pulsed current driver of claim 1, wherein:
   the externally-generated pulsed signal for turning the switch on and off is a part of the current level demand signal.

5. The pulsed current driver of claim 1, wherein:
   the externally-generated pulsed signal for turning the switch on and off is separate from the current level demand signal.

6. The pulsed current driver of claim 1, wherein:
   the power converter comprises a multiphase controller.

7. The pulsed current driver of claim 1, wherein:
   the power converter comprises a single phase converter controller.

8. The pulsed current driver of claim 1, wherein:
   the current-driven device is selected from the group consisting of a light emitting diode (LED), and a laser diode.

9. The pulsed current driver of claim 1, wherein:
   the switch comprises a solid state switching means.

10. The pulsed current driver of claim 9, wherein:
    the solid state switching means is selected from the group consisting of a field effect transistor (FET) and an insulated-gate bipolar transistor (IGBT).

11. The pulsed current driver of claim 1, wherein:
    the means for sensing current is selected from the group consisting of a low-value resistor, a current transformer, a Hall-effect sensor and means for measuring a voltage drop across the switch.

12. The pulsed current driver of claim 1, wherein:
    the switch is turned on and off at a frequency in the range of ten to thousands of Hertz with a duty cycle in the range of 0.001 to 0.5 (0.1-50%/o).

13. Method of driving a current-driven device comprising:
    providing a power converter having an output;
    providing a reservoir capacitor connected to the power converter output;
    connecting a current-driven device to the power converter output;
    connecting a switch in series with the current-driven device;
    providing an externally-generated pulsed signal for turning the switch on and off; and
    controlling the output of the power converter by comparing current flowing through the current-driven device to an externally-provided current level demand voltage signal.

14. The method of claim 13, wherein:
    the current level demand voltage signal is pulsed and includes the externally-generated pulsed signal.

15. The method of claim 13, wherein:
    the current level demand voltage signal is not pulsed and is separate from the externally-generated pulsed signal.

16. The method of claim 14, further comprising:
    providing the current level demand signal to an input of a fast comparator (222), the other input of which is connected to a voltage reference signal (224); and
    connecting the output of the fast comparator to the switch 212, to turn the switch ON and OFF.

17. The method of claim 14, further comprising:
    turning the switch ON whenever the Current Level Demand (220) is above zero.

18. The method of claim 13, wherein:
    the current-driven device is selected from the group consisting of a light emitting diode (LED) and a laser diode.

19. Method of providing fast risetime current pulses for driving a light-emitting current-driven device comprising:
    providing a multiphase power converter having an output;
    providing a reservoir capacitor connected to the power converter output;
    connecting a light-emitting current-driven device directly to the power converter output;
    connecting a switch in series with the current-driven device; and
    providing an externally-generated pulsed signal for turning the switch on and off.

20. The method of claim 19, further comprising:
    controlling the output of the power converter by comparing current flowing through the current-driven device to an externally-provided current level demand voltage signal.

* * * * *